(12) United States Patent
Ingalls et al.

(10) Patent No.: US 6,345,006 B1
(45) Date of Patent: Feb. 5, 2002

(54) MEMORY CIRCUIT WITH LOCAL ISOLATION AND PRE-CHARGE CIRCUITS

(75) Inventors: Charles L. Ingalls, Meridian; Huy T. Vo, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/642,089

(22) Filed: Aug. 21, 2000

(51) Int. Cl.$^7$ .................................................. G11C 7/00
(52) U.S. Cl. ........................ 365/205; 365/202; 365/203; 365/149
(58) Field of Search ............................ 365/205, 202, 365/203, 149, 189.01

(56) References Cited

U.S. PATENT DOCUMENTS

| | | | |
|---|---|---|---|
| 5,138,578 A | * 8/1992 | Fujii | ........................... 365/203 |
| 5,323,350 A | 6/1994 | McLaury | |
| 5,369,622 A | 11/1994 | McLaury | |
| 5,506,811 A | 4/1996 | McLaury | |
| 5,754,478 A | * 5/1998 | Morgan et al. | ......... 365/149 X |
| 5,923,592 A | 7/1999 | Morgan et al. | |

OTHER PUBLICATIONS

Hashimoto et al.; "An Embedded DRAM Module using a Dual Sense Amplifier Architecture in a Logic Process"; 1997 IEEE International solid State Circuit Conference, Digest of Technical Papers, pp. 64–65.

* cited by examiner

*Primary Examiner*—Huan Hoang
(74) *Attorney, Agent, or Firm*—Dickstein Shapiro Morin & Oshinsky LLP

(57) ABSTRACT

A sense amplifier circuit that decreases the write cycle row to column time and pre-charge time by locally isolating the digit lines from the N-sense and P-sense amplifier circuits and pre-charging the isolated digit lines is disclosed. A local isolation device is provided between the N-sense amplifier and the digit lines of a memory array. Similarly, a local isolation device is provided between the P-sense amplifier and the digit lines of the memory array. The local isolation devices are controlled by the inversion phase of the column select signal. Additionally, a local pre-charge circuit is provided to pre-charge the isolated digit lines to a voltage potential, such as for example Vcc. The local isolation and pre-charging of the digit lines provides for a faster write cycle, faster pre-charge time and faster row to column time.

110 Claims, 4 Drawing Sheets

MEMORY CIRCUIT WITH LOCAL ISOLATION AND PRE-CHARGE CIRCUITS

BACKGROUND OF THE INVENTION

1. Field of the Invention

The present invention relates generally to a semiconductor memory device and, more particularly, to a sense amplifier for use in a DRAM semiconductor device that provides local isolation and pre-charge circuits.

2. Description of the Related Art

An increasing number of electronic equipment and electronic-based systems require some form of high-speed memory devices for storing and retrieving information (or "data"). While the types of such memory devices vary widely, semiconductor memory devices are most commonly used in memory applications requiring implementation in a relatively small area. Within this class of semiconductor memory devices, the DRAM (Dynamic Random Access Memory) is one of the more commonly used types.

The DRAM has memory arrays consisting of a number of intersecting row and column lines of individual transistors or memory cells. In a conventional dynamic random access memory (DRAM) device each memory cell, or memory bit, consists of one transistor and one capacitor. A terminal of the transistor is connected to a digit line, or bitline, of the memory device. Another terminal of the transistor is connected to a terminal of the capacitor and the gate terminal of the transistor is connected to a wordline of the memory device. The transistor thus acts as a gate between the digit line and the capacitor.

The second terminal of the capacitor is connected to a voltage rail which carries a voltage, such as Vcc/2. Thus, when the wordline for a particular cell is active, the gate transistor is in a conducting state and the capacitor is connected to the digit line. The capacitor stores a charge that, depending on whether the capacitor is charged or discharged, represents either a logic high or a logic low value.

Typically, a microcomputer circuit selects (or activates) particular row and column lines to access selected memory cells. "Access" typically refers to reading data from or writing data to selected memory cells. Reading data from the memory cells involves the use of a sense amplifier to detect whether the voltage level stored in the memory cell represents a binary one (logic high) or a binary zero (logic low).

Memory devices are typically constructed with complementary digit lines of equal capacitance. Sense amplifiers are connected between the digit lines and operate to sense the differential voltage across the digit lines. Before a memory cell is selected for access, the complementary digit lines must be equilibrated. Equilibration circuits typically short the complementary digit lines together, resulting in an equilibrate voltage equal to the voltage midpoint between the two equal capacitance and logically opposite digit lines. Conventionally, a DRAM contains one sense amplifier for a designated group (row or column) of memory cells. If the voltage level stored in the memory cell represents a binary zero, after the sense amplifier is activated, one of the digit lines will increase in level, typically to a supply voltage Vcc, and the other digit line will decrease in level, typically to a ground level. If the voltage level stored in the selected memory cell corresponds to a binary one, a change in the opposite direction occurs. Through this complementary operation, the sense amplifier yields a single output signal which is coupled through an output buffer to an output pin of the DRAM device.

FIG. 1 illustrates a sense amplifier 10 of a DRAM device having a first array ARRAY0 20 and a second array ARRAY1 22, each of which comprises a plurality of memory cells 21 (shown in ARRAY0 20). As is generally known in the art, the term sense amplifier includes a collection of circuit elements connected to the digit lines of a DRAM array. This collection typically includes isolation transistors, devices for equilibration and bias, one or more N-sense amplifiers, one or more P-sense amplifiers, and devices connecting selected digit lines to input/output signal lines as will be described below.

As shown in FIG. 1, sense amplifier 10 includes a P-sense amplifier 70 and an N-sense amplifier 80 for sensing charge stored in the selected memory cell of the selected array 20, 22 via a voltage differential on the pair of digit lines D0 24 and D0* 26. One of the arrays 20, 22 is selected by application of signals ISOa and ISOb to transistors 32a, 32b and 34a, 34b, respectively. Thus, when ISOa is driven to a logic high value and ISOb is driven to a logic low value, transistors 32a and 32b become conductive, i.e., turn on, to connect ARRAY0 20 to P-sense amplifier 70 and N-sense amplifier 80 while transistors 34a and 34b do not conduct, i.e., turn off, to isolate ARRAY1 22 from P-sense amplifier 70 and N-sense amplifier 70. When ISOa is driven to a logic low value and ISOb is driven to a logic high value, transistors 34a and 34b turn on to connect ARRAY1 22 to P-sense amplifier 80 and N-sense amplifier 70 while transistors 32a and 32b turn off to isolate ARRAY0 20 from P-sense amplifier 80 and N-sense amplifier 70.

Equilibration circuits 50a and 50b are provided to equilibrate the digit lines D0 24 and D0* 26. Equilibration circuit 50a includes transistor 54 with a first source/drain region coupled to digit line D0 24, a second source/drain region coupled to digit line D0* 26 and a gate coupled to receive an equilibration signal EQa. Equilibration circuit 50a further includes first and second transistors 56 and 58. Transistor 56 includes a first source/drain region that is coupled to digit line D0 24, a gate that is coupled to receive the equilibration signal EQa and a second source/drain region that is coupled to receive an equilibration voltage Veq, which is typically equal to Vcc/2. Second transistor 58 includes a first source/drain region that is coupled to digit line D0* 26, a gate that is coupled to receive the equilibration signal EQa and a second source/drain region that is coupled to the equilibration voltage Veq. When the signal EQa is at a high logic level, equilibration circuit 50a effectively shorts digit line D0 24 to digit line D0* 26 such that both lines are equilibrated to the voltage Veq. Equilibration circuit 50b is constructed in a similar manner to equilibration circuit 50a and operates when the EQb signal is at a high logic level.

When P-sense amplifier 70 and N-sense amplifier 80 have sensed the differential voltage across the digit lines D0 24 and D0* 26 (as described below), a signal representing the charge stored in the accessed memory cell is output from the DRAM device on the input/output (I/O) lines I/O 36 and I/O* 38 by connecting the I/O lines I/O 36 and I/O* 38 to the digit lines D0 24 and D0* 26, respectively. A column select (CSEL) signal is applied to transistors 40, 42 to turn them on and connect the digit lines D0 24 and D0* 26 to the I/O lines I/O 36 and I/O* 38.

The operation of the P-sense amplifier 80 and N-sense amplifier 70 is as follows. These amplifiers work together to detect the access signal voltage and drive the digit lines D0 24 and D0* 26 to Vcc and ground accordingly. As shown in FIG. 1, the N-sense amplifier 80 consists of cross-coupled NMOS transistors 82, 84 and drives the low potential digit line to ground. Similarly, the P-sense amplifier 70 consists of cross-coupled PMOS transistors 72, 74 and drives the high potential digit line to Vcc. The NMOS pair 82, 84 or N-sense-amp common node is labeled RNL*. Similarly, the P-sense-amp 70 common node is labeled ACT (for ACTive pull-up). Initially, RNL* is biased to Vcc/2 and ACT is biased to ground. Since the digit line pair D0 24 and D0* 26 are both initially at Vcc/2 volts, the N-sense-amp transistors 82, 84 remain off due to zero Vgs potential. Similarly, both P-sense-amp transistors 72, 74 remain off due to their negative Vsg potential. As discussed in the preceding paragraph, a signal voltage develops between the digit line pair 24, 26 when the memory cell access occurs. While one digit line contains charge from the cell access, the other digit line serves as a reference for the sensing operation. The sense amplifier firing generally occurs sequentially rather than concurrently. The N-sense-amp 80 fires first and the P-sense-amp 70 second. Dropping the RNL* signal toward ground will fire the N-sense-amp 80. As the voltage between RNL* and the digit lines approaches Vt, the NMOS transistor whose gate connection is to the higher voltage digit line will begin to conduct. Conduction results in the discharge of the low voltage digit line toward the RNL* voltage. Ultimately, RNL* will reach ground, bringing the digit line with it. Note that the other NMOS transistor will not conduct since its gate voltage derives from the low voltage digit line, which is discharging toward ground.

Shortly after the N-sense-amp 80 fires, ACT will be driven toward Vcc. This activates the P-sense-amp 70 that operates in a complementary fashion to the N-sense-amp 80. With the low voltage digit line approaching ground, a strong signal exists to drive the appropriate PMOS transistor into conduction. This will charge the high voltage digit line toward ACT, ultimately reaching Vcc. Since the memory bit transistor remains on during sensing, the memory bit capacitor will charge to the RNL* or ACT voltage level. The voltage, and hence charge, which the memory bit capacitor held prior to accessing will restore a full level, i.e., Vcc for a logic one and GND for a logic zero.

There are problems, however, with the sense amplifier circuitry as illustrated in FIG. 1. As is well-known, integrated circuit memories are generally mass produced by fabricating hundreds of identical circuit patterns on a single semiconducting wafer. Each wafer is subsequently cut into hundreds of identical dies or chips. The advantages of building integrated circuits with smaller individual circuit elements are well known: more and more circuitry may be fabricated on a single chip, electronic equipment may become less bulky, reliability is improved by reducing the number of solder or plug connections, assembly and packaging costs are minimized, circuit performance may improve and higher clock speeds become feasible. For integrated circuit memories there are some disadvantages. As the size of the individual cell is reduced, the size of the individual electrical components in the cell and the strength of the electrical signals associated with them is also reduced. As the number of individual storage cells on a single chip is increased, the length of the digit lines connecting cells to sense amplifiers becomes longer. The capacitance associated with each digit line becomes large in comparison to the capacitance of a memory cell. Hence, the signals transferred to the digit line from an individual storage cell or I/O lines become weaker and the time for developing a useful signal level on a digit line will increase. As is well known, speed is an important factor in such memories. The faster the cells can be read and written, the faster the associated computer circuit of which the memory may be a part can operate, and the more functions the computer can adequately perform.

There remains a need for a memory architecture that allows fast write cycles.

SUMMARY OF THE INVENTION

The present invention alleviates the problems associated with the prior art and provides a sense amplifier circuit that decreases the write cycle, row to column time ($t_{RCD}$) and precharge time ($t_{RP}$) by locally isolating the digit lines from the N-sense and P-sense amplifier circuits and pre-charging the isolated digit lines.

In accordance with the present invention, a local isolation device is provided between the N-sense amplifier and the digit lines of a memory array. Similarly, a local isolation device is provided between the P-sense amplifier and the digit lines of the memory array. The local isolation devices are controlled by the inversion phase during the on state of the column select signal. Additionally, a local pre-charge circuit is provided to pre-charge the isolated digit lines to a voltage potential, such as for example Vcc. The local isolation and pre-charging of the digit lines provides for a faster write cycle, faster pre-charge time and faster row to column time.

These and other advantages and features of the invention will become more readily apparent from the following detailed description of the invention which is provided in connection with the accompanying drawings.

DETAILED DESCRIPTION OF THE PREFERRED EMBODIMENTS

Figure 1:
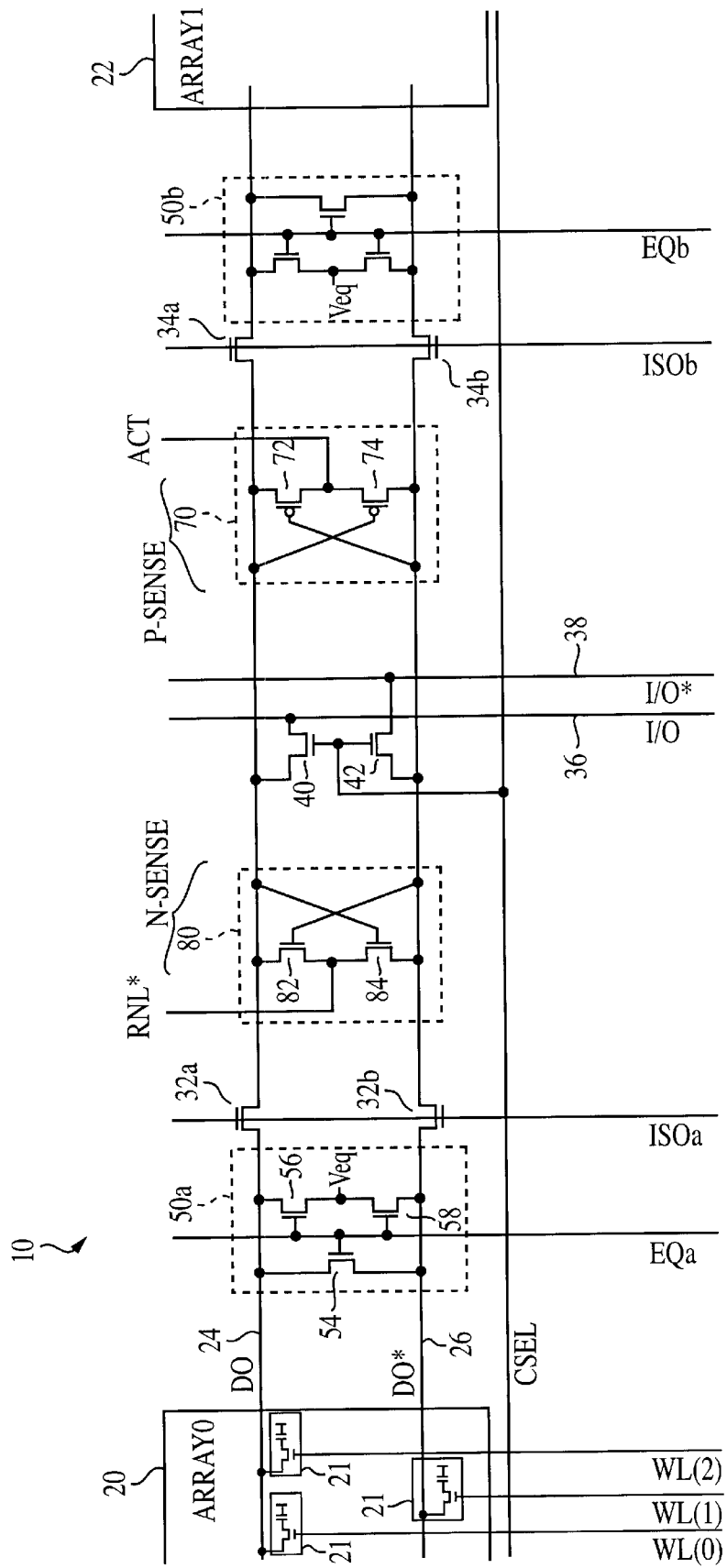
FIG. 1 illustrates a portion of a known DRAM device.

The present invention will be described as set forth in the preferred embodiments illustrated in FIGS. 2–4. Other embodiments may be utilized and structural or logical changes may be made without departing from the spirit or scope of the present invention. Like items are referred to by like reference numerals.

In accordance with the present invention, a local isolation device is provided between the N-sense amplifier and the digit lines of a memory array. Similarly, a local isolation device is provided between the P-sense amplifier and the digit lines of the memory array. The local isolation devices are controlled by the inversion phase of the column select signal. Additionally, a local pre-charge circuit is provided to pre-charge the isolated digit lines to a voltage potential, such as for example Vcc. The local isolation and pre-charging of the digit lines provides for a faster write cycle, row to column time $t_{RCD}$, i.e., the time from driving ACT to the first access, and the precharge time $t_{RP}$.

Figure 2:
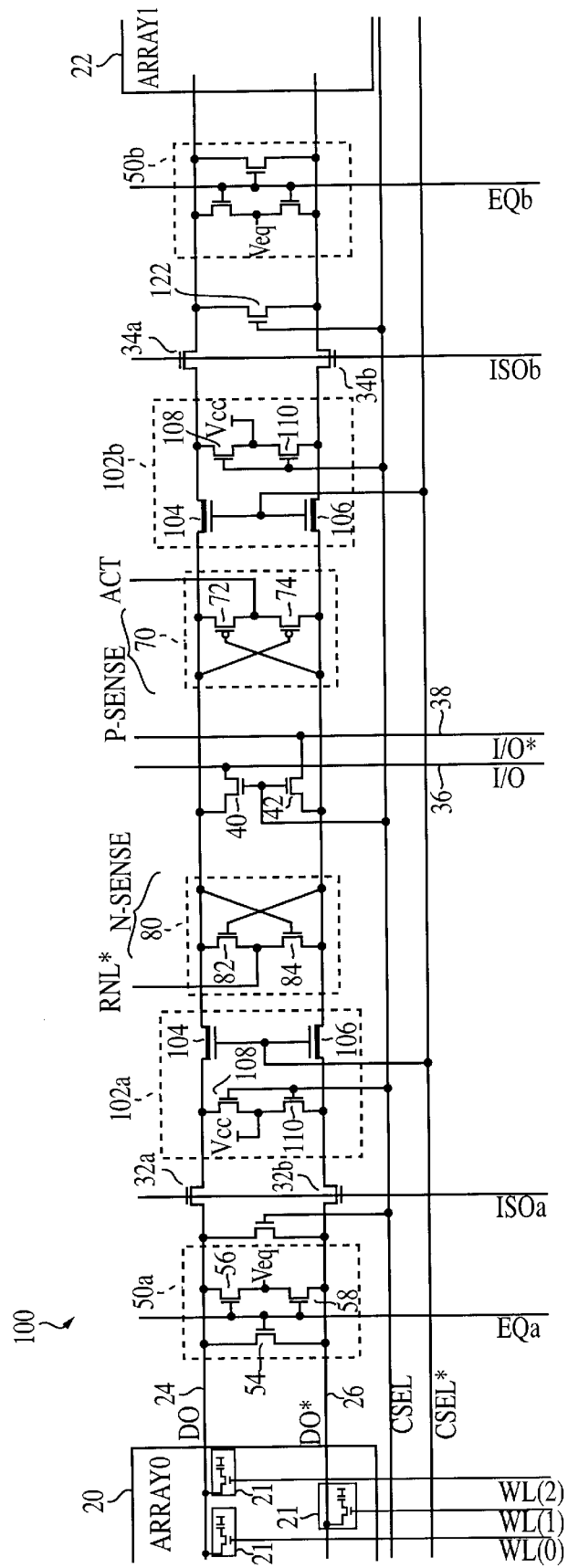
FIG. 2 illustrates a sense amplifier circuit according to one embodiment of the present invention.

FIG. 2 illustrates a sense amplifier circuit 100 in accordance with one embodiment of the present invention. Sense amplifier circuit 100 includes a P-sense amplifier 70, an N-sense amplifier 80, a pair of equilibration circuits 50a, 50b, isolation transistors 32a, 32b, 34a, 34b, and I/O transistors 40,42. Each of these elements is similar to those described with respect to FIG. 1, and their description will not be repeated here. In accordance with the present invention, sense amplifier circuit 100 is further provided with a pair of local isolation/pre-charge circuits 102a and 102b, and a pair of transistors 120, 122.

Transistor 120 has a first drain/source terminal connected to the digit line D0 24 between the memory array ARRAY0 20 and isolation transistor 32a and a second source/drain region connected to the digit line D0* 26 between the memory array ARRAY0 20 and isolation transistor 32b. The gate of transistor 120 is connected to the column select CSEL signal. Similarly, transistor 122 has a first drain/source terminal connected to the digit line D0 24 between the memory array ARRAY1 22 and isolation transistor 34a and a second source/drain region connected to the digit line D0* 26 between the memory array ARRAY1 22 and isolation transistor 34b. The gate of transistor 122 is connected to the column select CSEL signal. The CSEL signal level is preferably equal or higher than Vcc during its on state, i.e., high state.

Isolation/pre-charge circuit 102a includes pair of transistors 104, 106. Transistor 104 is serially connected in digit line D0 24 between N-sense amplifier 80 and isolation transistor 32a. Transistor 106 is serially connected in digit line D0* 26 between N-sense amplifier 80 and isolation transistor 32b. The gate of each transistor 104, 106 is connected to receive the complementary signal of the column select signal, CSEL*. This signal is preferably equal to or higher than Vcc during its on state, i.e., high state. Additionally, transistors 104, 106 preferably have a very low threshold voltage $V_t$ as illustrated in FIG. 2.

Circuit 102a further includes first and second transistors 108, and 110. Transistor 108 includes a first source/drain region that is coupled to digit line D0 24 between transistor 104 and transistor 32a, a gate that is coupled to receive the column select signal CSEL and a second source/drain region that is coupled to receive a voltage potential, such as for example Vcc. Second transistor 108 includes a first source/drain region that is coupled to digit line D0* 26 between transistor 106 and transistor 32b, a gate that is coupled to receive the column select signal CSEL and a second source/drain region that is coupled to the voltage potential. Circuit 102b is constructed similarly to circuit 102a and located between P-sense amplifier 70 and isolation transistors 34a, 34b.

The operation of sense amplifier circuit 100 is as follows. Suppose for example data is to be written into a selected cell 21 of one of the memory arrays ARRAY0 20 or ARRAY1 22. The data will be provided on the input/output lines, I/O and I/O*. The column select signal CSEL will transition from low to high, turning on transistors 40, 42 to connect the I/O lines to the digit lines D0 24 and D0* 26. When the column select signal CSEL goes high, transistors 108 and 110 of circuits 102a and 102b will turn on, connecting the digit lines D0 24 and D0* 26 to the voltage potential, such as Vcc, thereby pre-charging the digit lines. Additionally, transistors 120 and 122 will also turn on, connecting the digit lines D0 24 and D0* 26 to each other. When the column select signal CSEL is high, its complementary signal CSEL* will be low. The low signal applied to the gates of transistors 104, 106 of circuits 102a, 102b will turn transistors 104, 106 off, thereby isolating the P-sense amplifier 70 and N-sense amplifier 80 from the majority of the digit lines D0 24 and D0* 26.

The data on the I/O lines will now override the N-sense amplifier 80 and P-sense amplifier 70 and drive the digit lines D0 24 and D0* 26 to Vcc and ground accordingly faster than in prior art sense amplifier circuits, as there is less capacitance from the digit lines D0 24 and D0* 26 due to the isolation of the P-sense amplifier 70 and N-sense amplifier 80. The column select signal CSEL will transition from high to low, thereby turning off transistors 40, 42 to isolate the I/O lines from the digit lines D0 24 and D0* 26. Additionally, transistors 120, 122 and 108, 110 of circuits 102a and 102b will also turn off, disconnecting the digit lines D0 24 and D0* 26 from the voltage potential Vcc. When the signal CSEL goes low, the signal CSEL* will go high, thus turning on transistors 104, 106 of circuits 102a and 102b, thereby connecting the sense amplifier circuits 70, 80 to the digit lines. As described with respect to FIG. 1, if the memory cell 21 is in memory array ARRAY0 20, the signal ISOa will be high, thereby turning on transistors 32a, 32b to connect ARRAY0 20 to P-sense amplifier 70 and N-sense amplifier 80, while the signal ISOb will be low, maintaining transistors 34a and 34b in a non-conductive state to isolate ARRAY1 22 from the sense amplifier circuits 70, 80. The data will then be written into the memory cell 21 of the selected memory array via the digit lines D0 24 and D0* 26

As noted above, when transistors 104, 106 of circuit 102a turn on and the digit lines D0 24 and D0* 26 are connected to the N-sense amplifier 80 and P-sense amplifier 70, the data will be written to the digit lines D0 24 and D0* 26 and into the selected memory array. Since the digit lines D0 24 and D0* 26 have been pre-charged to Vcc through the operation of transistors 106, 108 and 120 in accordance with the present invention as described above, writing the data to the digit lines D0 24 and D0* 26 will require only the pulling down from Vcc to ground of the one digit line connected to the low potential node of amplifier circuits 70, 80. As the time required to pull one of the digit lines from Vcc down to ground is less than the time required to pull one of the digit lines up to Vcc, the precharge time $t_{RP}$ during the write cycle will be quicker as compared with conventional DRAM sense amplifiers.

Figure 3:
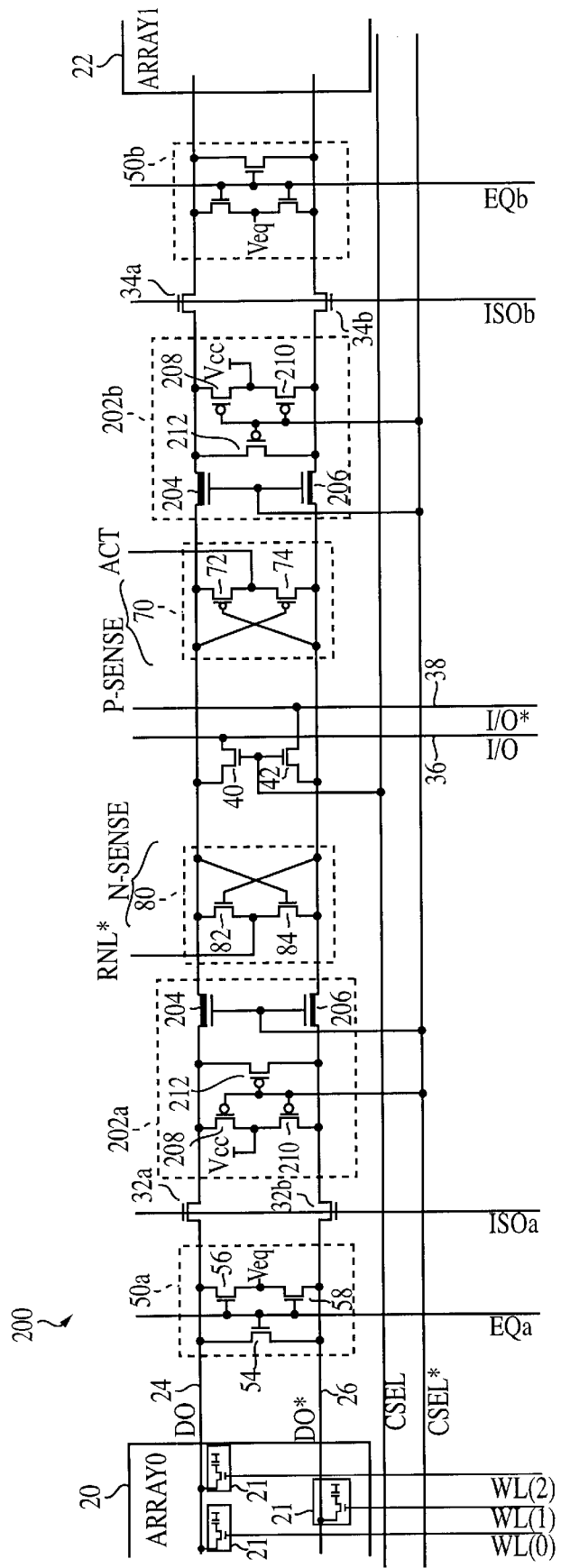
FIG. 3 illustrates a sense amplifier circuit according to another embodiment of the present invention.

FIG. 3 illustrates a sense amplifier circuit 200 in accordance with another embodiment of the present invention. Sense amplifier circuit 200 includes a P-sense amplifier 70, an N-sense amplifier 80, a pair of equilibration circuits 50a, 50b, isolation transistors 32a, 32b, 34a, 34b, and I/O transistors 40, 42. Each of these elements is similar to those described with respect to FIG. 1, and their description will not be repeated here. In accordance with the present invention, sense amplifier circuit 200 is further provided with a pair of local isolation/pre-charge circuits 202a and 202b.

Isolation/pre-charge circuit 202a includes pair of transistors 204, 206. Transistor 204 is serially connected in digit line D0 24 between N-sense amplifier 80 and isolation transistor 32a. Transistor 206 is serially connected in digit line D0* 26 between N-sense amplifier 80 and isolation transistor 32b. The gate of each transistor 204, 206 is connected to receive the complementary signal of the column select signal, CSEL*. This signal is preferably equal to or higher than Vcc during its on state, i.e., high state. Additionally, transistors 204, 206 preferably have a very low threshold voltage $V_t$ as illustrated in FIG. 3.

Circuit 202a further includes PMOS transistors 208, 210 and 212. Transistor 208 includes a first source/drain region that is coupled to digit line D0 24 between transistor 204 and transistor 32a, a gate that is coupled to receive the signal CSEL* and a second source/drain region that is coupled to receive a voltage potential, such as for example Vcc. Transistor 210 includes a first source/drain region that is coupled to digit line D0* 26 between transistor 206 and transistor 32b, a gate that is coupled to receive the signal CSEL*, and a second source/drain region that is coupled to the voltage potential. Transistor 212 has a first drain/source terminal connected to the digit line D0 24 between transistor 204 and isolation transistor 32a and a second source/drain region connected to the digit line D0* 26 between the transistor 206 and isolation transistor 32b. The gate of transistor 212 is connected to the signal CSEL*. Circuit 202b is constructed similarly to circuit 202a and located between P-sense amplifier 70 and isolation transistors 34a, 34b.

The operation of sense amplifier circuit 200 is as follows. Suppose for example data is to be written into a selected cell 21 of one of the memory arrays ARRAY0 20 or ARRAY1 22. The data will be provided on the input/output lines, I/O and I/O*. The column select signal CSEL will transition from low to high, turning on transistors 40, 42 to connect the I/O lines to the digit lines D0 24 and D0* 26. When the column select signal CSEL is high, its complementary signal CSEL* will be low. The low signal applied to the gates of transistors 204, 206 of circuits 202a, 202b will turn transistors 204, 206 off, thereby isolating the P-sense amplifier 70 and N-sense amplifier 80 from the majority of the digit lines D0 24 and D0* 26. Additionally, the low CSEL* signal applied to the gates of transistors 208, 210 and 212 turns on those transistors. The turning on of transistors 208 and 210 will connect the digit lines D0 24 and D0* 26 to the voltage potential, such as Vcc, thereby pre-charging the digit lines. The turning on of transistor 212 will connect the digit lines D0 24 and D0* 26 to each other.

The data on the I/O lines will now override the N-sense amplifier 80 and P-sense amplifier 70 and drive the digit lines D0 24 and D0* 26 to Vcc and ground accordingly faster than in prior art sense amplifier circuits, as there is less capacitance from the digit lines D0 24 and D0* 26 due to the isolation of the P-sense amplifier 70 and N-sense amplifier 80. The column select signal CSEL will transition from high to low, thereby turning off transistors 40, 42 to isolate the I/O lines from the digit lines D0 24 and D0* 26. When the signal CSEL goes low, the signal CSEL* will go high, thus turning off transistors 208, 210 and 212 of circuits 202a and 202b, thereby disconnecting the digit lines D0 24 and D0* 26 from the voltage potential Vcc and from each other. Additionally, transistors 204 and 206 of circuits 202a and 202b will turn on, thereby connecting the sense amplifier circuits 70, 80 to the digit lines. As described with respect to FIG. 1, if the memory cell 21 is in memory array ARRAY0 20, the signal ISOa will be high, thereby turning on transistors 32a, 32b to connect ARRAY0 20 to P-sense amplifier 70 and N-sense amplifier 80, while the signal ISOb will be low, maintaining transistors 34a and 34b in a non-conductive state to isolate ARRAY1 22 from the sense amplifier circuits 70, 80. The data will then be written into the memory cell 21 of the selected memory array via the digit lines D0 24 and D0* 26.

As noted above, when transistors 204, 206 of circuit 202a turn on and the digit lines D0 24 and D0* 26 are connected to the N-sense amplifier 80 and P-sense amplifier 70, the data will be written to the digit lines D0 24 and D0* 26. Since the digit lines D0 24 and D0* 26 have been pre-charged to Vcc through the operation of transistors 208, 210 and 212 in accordance with the present invention as described above, writing the data to the digit lines D0 24 and D0* 26 will require only the pulling down from Vcc to ground of the one digit line connected to the low potential node of amplifier circuits 70, 80. As the time required to pull one of the digit lines from Vcc down to ground is less than the time required to pull one of the digit lines up to Vcc, the precharge time trp during the write cycle will be quicker as compared with conventional DRAM sense amplifiers.

The local isolation and pre-charge circuits of the present invention will also decrease the time required for a read cycle by allowing for a faster row to column time $t_{RCD}$. For example, suppose a memory cell 21 of ARRAY0 20 is to be accessed for a read operation. Its corresponding wordline would be driven high to turn on the cell's transistor and attach the bit capacitor to its associated digit line, such as for example D0 24. After the cell has been accessed, sensing will occur. Sensing is essentially the amplification of the digit line signal, i.e., the differential voltage between the digit lines D0 24 and D0* 26, as previously described with respect to FIG. 1. In a conventional sense amplifier circuit such as illustrated in FIG. 1, it is necessary to provide a delay between the time ACT is driven towards Vcc and the time the CSEL signal is driven high to connect the sense amplifier circuit to the I/O lines I/O 36 and I/O* 38 to allow the digit lines D0 24 and D0* 26 to be driven to Vcc and ground accordingly. This delay is dependent upon the length of the digit lines D0 24 and D0* 26, as the longer the digit lines the higher the capacitance of the digit lines, thereby increasing the time necessary to drive the digit lines to Vcc and ground. In accordance with the present invention, as illustrated in FIGS. 2 and 3, this delay is minimized by shortening the length of the digit lines D0 24 and D0* 26 via the local isolation circuits. For example, when the CSEL signal is driven high to connect the connect the sense amplifier circuit to the I/O lines I/O 36 and I/O*38, transistors 104, 106 of FIG. 2 and 204, 206 of FIG. 3 will turn off, thereby separating the N-sense amplifier 80 and P-sense amplifier 70 from the majority of the digit lines D0 24 and D0* 26. Accordingly, there will be less capacitance from the digit lines D0 24 and D0* 26 for the N-sense amplifier 80 and P-sense amplifier 70 to overcome to drive the portion of the digit lines D0 24 and D0* 26 still connected to the N-sense amplifier 80 and P-sense amplifier 70 to Vcc and ground. Thus, it is not necessary to provide as long as a delay between the firing of the ACT signal and the CSEL signal during a read access with the local isolation circuits of the present invention, thereby decreasing the time required for a read cycle by allowing for a faster row to column time $t_{RCD}$.

Figure 4:
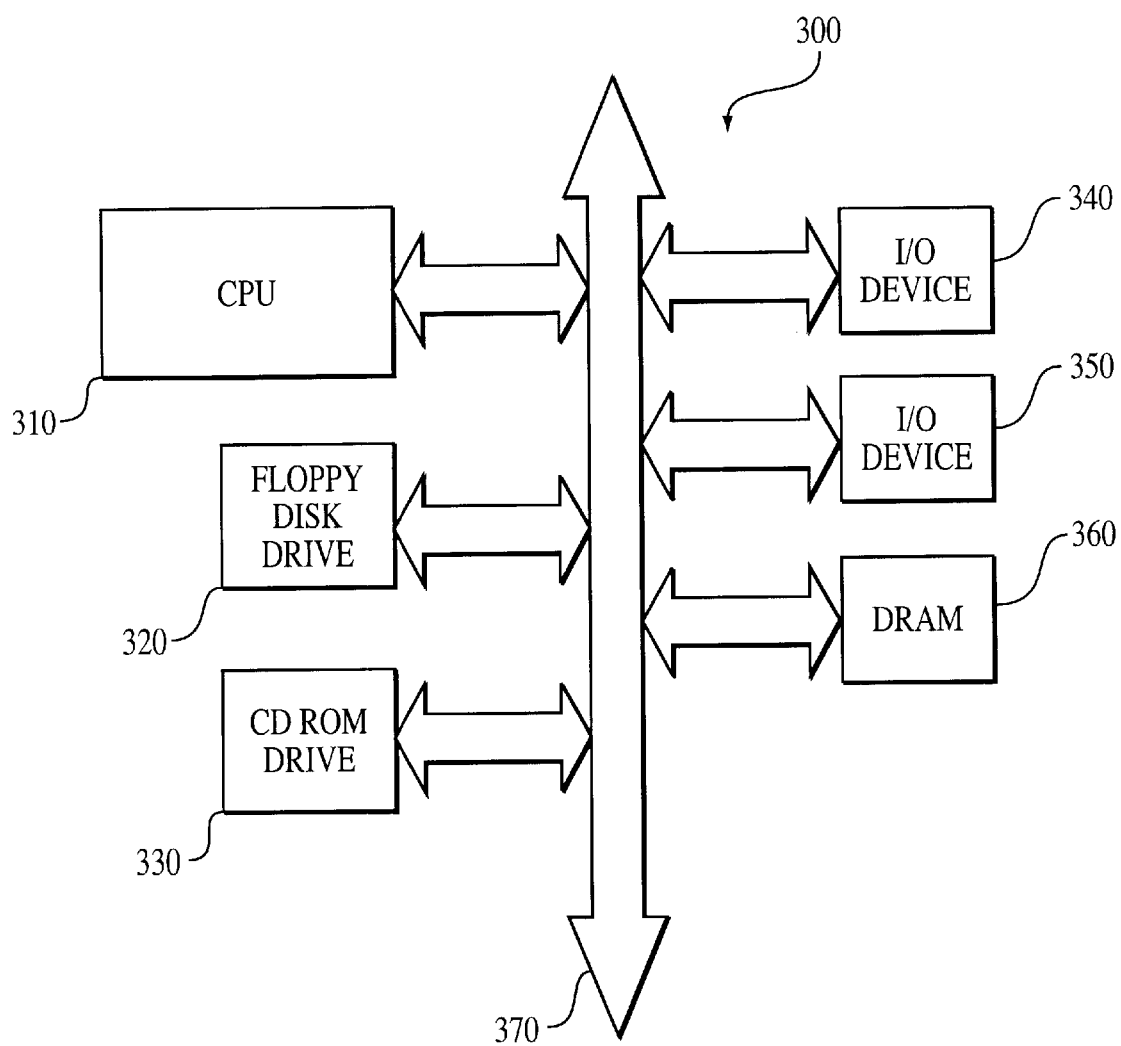
FIG. 4 illustrates in block diagram form a processor system that includes a DRAM having a sense amplifier in accordance with the present invention.

A typical processor based system which includes integrated circuits that utilize a sense amplifier according to the present invention is illustrated generally at 300 in FIG. 4. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 310, for example, a microprocessor, that communicates with one or more input/output (I/O) devices 340, 350 over a bus 370. The computer system 300 also includes random access memory, such as DRAM 360, and, in the case of a computer system may include peripheral devices such as a floppy disk drive 320 and a compact disk (CD) ROM drive 330 which also communicate with CPU 310 over the bus 370. DRAM 360 is preferably constructed as an integrated circuit which includes a sense amplifier as previously described with respect to FIGS. 2 and 3. It may also be desirable to integrate the processor 310 and DRAM 360 on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A sense amplifier comprising:
   a first amplifier circuit connected to a first and second digit line associated with a plurality of memory arrays;
   a first isolation circuit connected to said first and second digit lines between said first amplifier circuit and a first of said plurality of memory arrays;
   a first equilibration circuit connected to said first and second digit lines between said first isolation circuit and said first of said plurality of memory arrays;
   a first transistor having a first terminal connected to said first digit line between said first isolation circuit and said first equilibration circuit, a second terminal connected to said second digit line between said first isolation circuit and said first equilibration circuit, and a gate terminal connected to receive a first control signal;
   a second isolation circuit including a second transistor serially connected in said first digit line between said first amplifier circuit and said first isolation circuit and a third transistor serially connected in said second digit line between said first amplifier circuit and said first isolation circuit, said second and third transistor each having a gate terminal connected to receive a second control signal; and
   a first precharge circuit connected to said first and second digit lines between said second isolation circuit and said first isolation circuit.

2. The sense amplifier according to claim 1, wherein said first control signal is a column select signal.

3. The sense amplifier according to claim 2, wherein said second control signal is complementary to said column select signal.

4. The sense amplifier according to claim 1, wherein said precharge circuit further comprises:
   a fourth transistor having a first terminal connected said first digit line, a second terminal connected to a voltage potential, and a gate terminal connected to receive said first control signal; and
   a fifth transistor having a first terminal connected to said second digit line, a second terminal connected to said voltage potential, and a gate terminal connected to receive said first control signal.

5. The sense amplifier according to claim 4, wherein said voltage potential is Vcc.

6. The sense amplifier according to claim 1, wherein said second and third transistors are low threshold voltage transistors.

7. The sense amplifier according to claim 1, wherein said second control signal is equal to or greater than Vcc during a high state.

8. The sense amplifier according to claim 1, further comprising:
   a second amplifier circuit connected to said first and second digit lines between said first amplifier circuit and a second of said plurality of memory arrays;
   a third isolation circuit connected to said first and second digit lines between said second amplifier circuit and said second of said plurality of memory arrays;
   a second equilibration circuit connected to said first and second digit lines between said third isolation circuit and said second of said plurality of memory arrays;
   a sixth transistor having a first terminal connected to said first digit line between said third isolation circuit and said second equilibration circuit, a second terminal connected to said second digit line between said third isolation circuit and said second equilibration circuit, and a gate terminal connected to receive said first control signal;
   a fourth isolation circuit including a seventh transistor serially connected in said first digit line between said second amplifier circuit and said third isolation circuit and an eighth transistor serially connected in said second digit line between said second amplifier circuit and said third isolation circuit, said seventh and eighth transistor each having a gate terminal connected to receive said second control signal; and
   a second precharge circuit connected to said first and second digit lines between said fourth isolation circuit and said third isolation circuit.

9. The sense amplifier according to claim 8, wherein said first control signal is a column select signal.

10. The sense amplifier according to claim 9, wherein said second control signal is complementary to said column select signal.

11. The sense amplifier according to claim 8, wherein said second precharge circuit further comprises:
    a ninth transistor having a first terminal connected to said first digit line, a second terminal connected to a voltage potential, and a gate terminal connected to receive said first control signal; and
    a tenth transistor having a first terminal connected to said second digit line, a second terminal connected to said voltage potential, and a gate terminal connected to receive said first control signal.

12. The sense amplifier according to claim 11, wherein said voltage potential is Vcc.

13. The sense amplifier according to claim 8, wherein said seventh and eighth transistors are low threshold voltage transistors.

14. The sense amplifier according to claim 8, wherein said second control signal is equal to or greater than Vcc during a high state.

15. A sense amplifier comprising:
    a first amplifier circuit connected to a first and second digit line associated with a plurality of memory arrays;
    a first isolation circuit connected to said first and second digit lines between said first amplifier circuit and a first of said plurality of memory arrays;
    an equilibration circuit connected to said first and second digit lines between said first isolation circuit and said first of said plurality of memory arrays;
    a second isolation circuit including a first transistor serially connected in said first digit line between said first amplifier circuit and said first isolation circuit and a second transistor serially connected in said second digit line between said first amplifier circuit and said first isolation circuit, said first and second transistor each having a gate terminal connected to receive a control signal; and
    a precharge circuit connected to said first and second digit lines between said second isolation circuit and said first isolation circuit.

16. The sense amplifier according to claim 15, wherein said control signal is complementary to a column select signal.

17. The sense amplifier according to claim 15, wherein said precharge circuit further comprises:
   a first PMOS transistor having a first terminal connected said first digit line, a second terminal connected to a voltage potential, and a gate terminal connected to receive said control signal;
   a second PMOS transistor having a first terminal connected to said second digit line, a second terminal connected to said voltage potential, and a gate terminal connected to receive said control signal; and
   a third PMOS transistor having a first terminal connected to said first digit line, a second terminal connected to said second digit line, and a gate terminal connected to receive said control signal.

18. The sense amplifier according to claim 17, wherein said voltage potential is Vcc.

19. The sense amplifier according to claim 15, wherein said first and second transistors are low threshold voltage transistors.

20. The sense amplifier according to claim 15, wherein said control signal is equal to or greater than Vcc during a high state.

21. The sense amplifier according to claim 15, further comprising:
   a second amplifier circuit connected to said first and second digit lines between said first amplifier circuit and a second of said plurality of memory arrays;
   a third isolation circuit connected to said first and second digit lines between said second amplifier circuit and said second of said plurality of memory arrays;
   a second equilibration circuit connected to said first and second digit lines between said third isolation circuit and said second of said plurality of memory arrays;
   a fourth isolation circuit including a sixth transistor serially connected in said first digit line between said second amplifier circuit and said third isolation circuit and a seventh transistor serially connected in said second digit line between said second amplifier circuit and said third isolation circuit, said sixth and seventh transistors each having a gate terminal connected to receive said control signal; and
   a second precharge circuit connected to said first and second digit lines between said fourth isolation circuit and said third isolation circuit.

22. The sense amplifier according to claim 21, wherein said control signal is complementary to a column select signal.

23. The sense amplifier according to claim 21, wherein said second precharge circuit further comprises:
   a fourth PMOS transistor having a first terminal connected said first digit line, a second terminal connected to said voltage potential, and a gate terminal connected to receive said control signal;
   a fifth PMOS transistor having a first terminal connected to said second digit line, a second terminal connected to said voltage potential, and a gate terminal connected to receive said control signal; and
   a sixth PMOS transistor having a first terminal connected to said first digit line, a second terminal connected to said second digit line, and a gate terminal connected to receive said control signal.

24. The sense amplifier according to claim 23, wherein said voltage potential is Vcc.

25. The sense amplifier according to claim 21, wherein said sixth and seventh transistors of said fourth isolation circuit are low threshold voltage transistors.

26. The sense amplifier according to claim 21, wherein said control signal is equal to or greater than Vcc during a high state.

27. A sense amplifier for a memory device comprising:
   an amplifier circuit connected to a first and second digit line of said memory device;
   an isolation circuit connected to said first and second digit line between said amplifier circuit and a first memory array of said memory device;
   an equilibration circuit connected to said first and second digit lines between said isolation circuit and said first memory array;
   a first circuit connected to said first and second digit lines between said amplifier circuit and said isolation circuit, said first circuit in response to a first control signal isolating said amplifier circuit from a portion of said first and second digit lines; and
   a precharge circuit connected to said first and second digit lines between said first circuit and said isolation circuit, said precharge circuit charging said portion of said first and second digit lines to a voltage potential.

28. The sense amplifier according to claim 27, further comprising:
   a second circuit connected to said first and second digit lines between said isolation circuit and said equilibration circuit, said second circuit connecting said first and second digit lines together in response to a second control signal.

29. The sense amplifier according to claim 28, wherein said second circuit further comprises:
   a transistor having a first terminal connected to said first digit line between said isolation circuit and said equilibration circuit, a second terminal connected to said second digit line between said isolation circuit and said equilibration circuit, and a gate terminal connected to receive said second control signal.

30. The sense amplifier according to claim 28, wherein said precharge circuit further comprises:
   a first transistor having a first terminal connected said first digit line, a second terminal connected to said voltage potential, and a gate terminal connected to receive said second control signal; and
   a second transistor having a first terminal connected to said second digit line, a second terminal connected to said voltage potential, and a gate terminal connected to receive said second control signal.

31. The sense amplifier according to claim 30, wherein said second control signal is a column select signal.

32. The sense amplifier according to claim 30, wherein said voltage potential is Vcc.

33. The sense amplifier according to claim 27, wherein said first circuit further comprises:
   a first transistor serially connected in said first digit line between said amplifier circuit and said isolation circuit and a second transistor serially connected in said second digit line between said amplifier circuit and said isolation circuit, said first and second transistor each having a gate terminal connected to receive said first control signal.

34. The sense amplifier according to claim 33, wherein said first control signal is complementary to a column select signal.

35. The sense amplifier according to claim 33, wherein said first control signal is equal to or greater than Vcc during a high state.

36. The sense amplifier according to claim 27, wherein said precharge circuit further comprises:
   a first transistor having a first terminal connected said first digit line, a second terminal connected to said voltage potential, and a gate terminal connected to receive said first control signal;
   a second transistor having a first terminal connected to said second digit line, a second terminal connected to said voltage potential, and a gate terminal connected to receive said first control signal; and
   a third transistor having a first terminal connected to said first digit line, a second terminal connected to said second digit line, and a gate terminal connected to receive said first control signal.

37. The sense amplifier according to claim 36, wherein said first control signal is complementary to a column select signal.

38. The sense amplifier according to claim 37, wherein said voltage potential is Vcc.

39. A memory device comprising:
   a plurality of memory arrays, each of said plurality of memory arrays having a plurality of cells arranged in rows and columns;
   a plurality of pairs of digit lines, each of said plurality of pairs of digit lines being associated with at least one of said plurality of memory arrays; and
   a plurality of sense amplifiers, each of said plurality of sense amplifiers comprising:
      a first amplifier circuit connected to a first and second digit line of one of said plurality of pairs of digit lines associated with a first of said plurality of memory arrays;
      a first isolation circuit connected to said first and second digit lines between said first amplifier circuit and a first of said plurality of memory arrays;
      a first equilibration circuit connected to said first and second digit lines between said first isolation circuit and said first of said plurality of memory arrays;
      a first transistor having a first terminal connected to said first digit line between said first isolation circuit and said first equilibration circuit, a second terminal connected to said second digit line between said first isolation circuit and said first equilibration circuit, and a gate terminal connected to receive a first control signal;
      a second isolation circuit including a second transistor serially connected in said first digit line between said first amplifier circuit and said first isolation circuit and a third transistor serially connected in said second digit line between said first amplifier circuit and said first isolation circuit, said second and third transistor each having a gate terminal connected to receive a second control signal; and
      a first precharge circuit connected to said first and second digit lines between said second isolation circuit and said first isolation circuit.

40. The memory device according to claim 39, wherein said first control signal is a column select signal.

41. The memory device according to claim 40, wherein said second control signal is complementary to said column select signal.

42. The memory device according to claim 39, wherein said first precharge circuit further comprises:

a fourth transistor having a first terminal connected said first digit line, a second terminal connected to a voltage potential, and a gate terminal connected to receive said first control signal; and
   a fifth transistor having a first terminal connected to said second digit line, a second terminal connected to said voltage potential, and a gate terminal connected to receive said first control signal.

43. The memory device according to claim 42, wherein said voltage potential is Vcc.

44. The memory device according to claim 39, wherein said second and third transistors are low threshold voltage transistors.

45. The memory device according to claim 39, wherein said second control signal is equal to or greater than Vcc during a high state.

46. The memory device according to claim 39, wherein each of said plurality of sense amplifiers further comprises:
   a second amplifier circuit connected to said first and second digit lines between said first amplifier circuit and a second of said plurality of memory arrays;
   a third isolation circuit connected to said first and second digit lines between said second amplifier circuit and said second of said plurality of memory arrays;
   a second equilibration circuit connected to said first and second digit lines between said third isolation circuit and said second of said plurality of memory arrays;
   a sixth transistor having a first terminal connected to said first digit line between said third isolation circuit and said second equilibration circuit, a second terminal connected to said second digit line between said third isolation circuit and said second equilibration circuit, and a gate terminal connected to receive said first control signal;
   a fourth isolation circuit including a seventh transistor serially connected in said first digit line between said second amplifier circuit and said third isolation circuit and an eighth transistor serially connected in said second digit line between said second amplifier circuit and said third isolation circuit, said seventh and eighth transistor each having a gate terminal connected to receive said second control signal; and
   a second precharge circuit connected to said first and second digit lines between said fourth isolation circuit and said third isolation circuit.

47. The memory device according to claim 46, wherein said first control signal is a column select signal.

48. The memory device according to claim 47, wherein said second control signal is complementary to said column select signal.

49. The memory device according to claim 46, wherein said second precharge circuit further comprises:
   a ninth transistor having a first terminal connected to said first digit line, a second terminal connected to a voltage potential, and a gate terminal connected to receive said first control signal; and
   a tenth transistor having a first terminal connected to said second digit line, a second terminal connected to said voltage potential, and a gate terminal connected to receive said first control signal.

50. The memory device according to claim 49, wherein said voltage potential is Vcc.

51. The memory device according to claim 39, wherein said seventh and eighth transistors are low threshold voltage transistors.

52. The memory device according to claim 39, wherein said second control signal is equal to or greater than Vcc during a high state.

53. A memory device comprising:
- a plurality of memory arrays, each of said plurality of memory arrays having a plurality of cells arranged in rows and columns;
- a plurality of pairs of digit lines, each of said plurality of pairs of digit lines being associated with at least one of said plurality of memory arrays; and
- a plurality of sense amplifiers, each of said plurality of sense amplifiers comprising:
  - a first amplifier circuit connected to a first and second digit line of one of said plurality of pairs of digit lines associated with a first of said plurality of memory arrays;
  - a first isolation circuit connected to said first and second digit lines between said first amplifier circuit and a first of said plurality of memory arrays;
  - an equilibration circuit connected to said first and second digit lines between said first isolation circuit and said first of said plurality of memory arrays;
  - a second isolation circuit including a first transistor serially connected in said first digit line between said first amplifier circuit and said first isolation circuit and a second transistor serially connected in said second digit line between said first amplifier circuit and said first isolation circuit, said first and second transistor each having a gate terminal connected to receive a control signal; and
  - a precharge circuit connected to said first and second digit lines between said second isolation circuit and said first isolation circuit.

54. The memory device according to claim 53, wherein said control signal is complementary to a column select signal.

55. The memory device according to claim 53, wherein said precharge circuit further comprises:
- a first PMOS transistor having a first terminal connected said first digit line, a second terminal connected to a voltage potential, and a gate terminal connected to receive said control signal;
- a second PMOS transistor having a first terminal connected to said second digit line, a second terminal connected to said voltage potential, and a gate terminal connected to receive said control signal; and
- a third PMOS transistor having a first terminal connected to said first digit line, a second terminal connected to said second digit line, and a gate terminal connected to receive said control signal.

56. The memory device according to claim 55, wherein said voltage potential is Vcc.

57. The memory device according to claim 53, wherein said first and second transistors are low threshold voltage transistors.

58. The memory device according to claim 53, wherein said control signal is equal to or greater than Vcc during a high state.

59. The memory device according to claim 53, wherein each of said plurality of sense amplifiers further comprises:
- a second amplifier circuit connected to said first and second digit lines between said first amplifier circuit and a second of said plurality of memory arrays;
- a third isolation circuit connected to said first and second digit lines between said second amplifier circuit and said second of said plurality of memory arrays;
- a second equilibration circuit connected to said first and second digit lines between said third isolation circuit and said second of said plurality of memory arrays;
- a fourth isolation circuit including a sixth transistor serially connected in said first digit line between said second amplifier circuit and said third isolation circuit and a seventh transistor serially connected in said second digit line between said second amplifier circuit and said third isolation circuit, said sixth and seventh transistors each having a gate terminal connected to receive said control signal; and
- a second precharge circuit connected to said first and second digit lines between said fourth isolation circuit and said third isolation circuit.

60. The memory device according to claim 59, wherein said control signal is complementary to a column select signal.

61. The memory device according to claim 59, wherein said second precharge circuit further comprises:
- a fourth PMOS transistor having a first terminal connected said first digit line, a second terminal connected to said voltage potential, and a gate terminal connected to receive said control signal;
- a fifth PMOS transistor having a first terminal connected to said second digit line, a second terminal connected to said voltage potential, and a gate terminal connected to receive said control signal; and
- a sixth PMOS transistor having a first terminal connected to said first digit line, a second terminal connected to said second digit line, and a gate terminal connected to receive said control signal.

62. The memory device according to claim 61, wherein said voltage potential is Vcc.

63. The memory device according to claim 59, wherein said sixth and seventh transistors of said fourth isolation circuit are low threshold voltage transistors.

64. The memory device according to claim 59, wherein said control signal is equal to or greater than Vcc during a high state.

65. A processor system comprising:
- a central processing unit; and
- a memory device connected to said processing unit to receive data from and supply data to said central processing unit, said memory device comprising:
  - a plurality of memory arrays, each of said plurality of memory arrays having a plurality of cells arranged in rows and columns;
  - a plurality of pairs of digit lines, each of said plurality of pairs of digit lines being associated with at least one of said plurality of memory arrays; and
  - a plurality of sense amplifiers, each of said plurality of sense amplifiers comprising:
    - a first amplifier circuit connected to a first and second digit line of one of said plurality of pairs of digit lines associated with a first of said plurality of memory arrays;
    - a first isolation circuit connected to said first and second digit lines between said first amplifier circuit and a first of said plurality of memory arrays;
    - a first equilibration circuit connected to said first and second digit lines between said first isolation circuit and said first of said plurality of memory arrays;
    - a first transistor having a first terminal connected to said first digit line between said first isolation circuit and said first equilibration circuit, a second terminal connected to said second digit line between said first isolation circuit and said first equilibration circuit, and a gate terminal connected to receive a first control signal;

a second isolation circuit including a second transistor serially connected in said first digit line between said first amplifier circuit and said first isolation circuit and a third transistor serially connected in said second digit line between said first amplifier circuit and said first isolation circuit, said second and third transistor each having a gate terminal connected to receive a second control signal; and a first precharge circuit connected to said first and second digit lines between said second isolation circuit and said first isolation circuit.

66. The processor system according to claim 65, wherein said first control signal is a column select signal.

67. The processor system according to claim 66, wherein said second control signal is complementary to said column select signal.

68. The processor system according to claim 67, wherein said first precharge circuit further comprises:

a fourth transistor having a first terminal connected said first digit line, a second terminal connected to a voltage potential, and a gate terminal connected to receive said first control signal; and a fifth transistor having a first terminal connected to said second digit line, a second terminal connected to said voltage potential, and a gate terminal connected to receive said first control signal.

69. The processor system according to claim 68, wherein said voltage potential is Vcc.

70. The processor system according to claim 65, wherein said second and third transistors are low threshold voltage transistors.

71. The processor system according to claim 65, wherein said second control signal is equal to or greater than Vcc during a high state.

72. The processor system according to claim 65, wherein each of said plurality of sense amplifiers further comprises:

a second amplifier circuit connected to said first and second digit lines between said first amplifier circuit and a second of said plurality of memory arrays;

a third isolation circuit connected to said first and second digit lines between said second amplifier circuit and said second of said plurality of memory arrays;

a second equilibration circuit connected to said first and second digit lines between said third isolation circuit and said second of said plurality of memory arrays;

a sixth transistor having a first terminal connected to said first digit line between said third isolation circuit and said second equilibration circuit, a second terminal connected to said second digit line between said third isolation circuit and said second equilibration circuit, and a gate terminal connected to receive said first control signal;

a fourth isolation circuit including a seventh transistor serially connected in said first digit line between said second amplifier circuit and said third isolation circuit and an eighth transistor serially connected in said second digit line between said second amplifier circuit and said third isolation circuit, said seventh and eighth transistor each having a gate terminal connected to receive said second control signal; and a second precharge circuit connected to said first and second digit lines between said fourth isolation circuit and said third isolation circuit.

73. The processor system according to claim 72, wherein said first control signal is a column select signal.

74. The processor system according to claim 73, wherein said second control signal is complementary to said column select signal.

75. The processor system according to claim 72, wherein said second precharge circuit further comprises:

a ninth transistor having a first terminal connected to said first digit line, a second terminal connected to a voltage potential, and a gate terminal connected to receive said first control signal; and a tenth transistor having a first terminal connected to said second digit line, a second terminal connected to said voltage potential, and a gate terminal connected to receive said first control signal.

76. The processor system according to claim 75, wherein said voltage potential is Vcc.

77. The processor system according to claim 76, wherein said seventh and eighth transistors are low threshold voltage transistors.

78. The processor system according to claim 76, wherein said second control signal is equal to or greater than Vcc during a high state.

79. The processor system according to claim 76, wherein said central processing unit and said memory device are on a single chip.

80. A processor system comprising:

a central processing unit; and a memory device connected to said processing unit to receive data from and supply data to said central processing unit, said memory device comprising:

a plurality of memory arrays, each of said plurality of memory arrays having a plurality of cells arranged in rows and columns;

a plurality of pairs of digit lines, each of said plurality of pairs of digit lines being associated with at least one of said plurality of memory arrays; and a plurality of sense amplifiers, each of said plurality of sense amplifiers comprising:

a first amplifier circuit connected to a first and second digit line of one of said plurality of pairs of digit lines associated with a first of said plurality of memory arrays;

a first isolation circuit connected to said first and second digit lines between said first amplifier circuit and a first of said plurality of memory arrays;

an equilibration circuit connected to said first and second digit lines between said first isolation circuit and said first of said plurality of memory arrays;

a second isolation circuit including a first transistor serially connected in said first digit line between said first amplifier circuit and said first isolation circuit and a second transistor serially connected in said second digit line between said first amplifier circuit and said first isolation circuit, said first and second transistor each having a gate terminal connected to receive a control signal; and a precharge circuit connected to said first and second digit lines between said second isolation circuit and said first isolation circuit.

81. The processor system according to claim 80, wherein said control signal is complementary to a column select signal.

82. The processor system according to claim 80, wherein said precharge circuit further comprises:

a first PMOS transistor having a first terminal connected said first digit line, a second terminal connected to a voltage potential, and a gate terminal connected to receive said control signal;

a second PMOS transistor having a first terminal connected to said second digit line, a second terminal connected to said voltage potential, and a gate terminal connected to receive said control signal; and a third PMOS transistor having a first terminal connected to said first digit line, a second terminal connected to said second digit line, and a gate terminal connected to receive said control signal.

83. The processor system according to claim 82, wherein said voltage potential is Vcc.

84. The processor system according to claim 80, wherein said first and second transistors are low threshold voltage transistors.

85. The processor system according to claim 80, wherein said control signal is equal to or greater than Vcc during a high state.

86. The processor system according to claim 80, wherein each of said plurality of sense amplifiers further comprises:

a second amplifier circuit connected to said first and second digit lines between said first amplifier circuit and a second of said plurality of memory arrays;

a third isolation circuit connected to said first and second digit lines between said second amplifier circuit and said second of said plurality of memory arrays;

a second equilibration circuit connected to said first and second digit lines between said third isolation circuit and said second of said plurality of memory arrays;

a fourth isolation circuit including a sixth transistor serially connected in said first digit line between said second amplifier circuit and said third isolation circuit and a seventh transistor serially connected in said second digit line between said second amplifier circuit and said third isolation circuit, said sixth and seventh transistors each having a gate terminal connected to receive said control signal; and a second precharge circuit connected to said first and second digit lines between said fourth isolation circuit and said third isolation circuit.

87. The processor system according to claim 86, wherein said control signal is complementary to a column select signal.

88. The processor system according to claim 86, wherein said second precharge circuit further comprises:

a fourth PMOS transistor having a first terminal connected said first digit line, a second terminal connected to said voltage potential, and a gate terminal connected to receive said control signal;

a fifth PMOS transistor having a first terminal connected to said second digit line, a second terminal connected to said voltage potential, and a gate terminal connected to receive said control signal; and a sixth PMOS transistor having a first terminal connected to said first digit line, a second terminal connected to said second digit line, and a gate terminal connected to receive said control signal.

89. The memory device according to claim 88, wherein said voltage potential is Vcc.

90. The memory device according to claim 86, wherein said sixth and seventh transistors of said fourth isolation circuit are low threshold voltage transistors.

91. The memory device according to claim 86, wherein said control signal is equal to or greater than Vcc during a high state.

92. A method for writing data into a memory cell comprising the steps of:

isolating a first portion of a pair of digit lines associated with said memory cell from said memory cell, said first portion of said pair of digit lines including an amplifier circuit connected to said pair of digit lines, said first portion receiving said data from input/output lines associated with said pair of digit lines;

overriding said amplifier circuit with said data;

isolating said input/output lines from said pair of digit lines; and connecting said first portion of said pair of digit lines to said second portion of said pair of digit lines to write said data to said memory cell.

93. The method according to claim 92, wherein said step of isolating a first portion of said pair of digit lines further comprises:

charging a second portion of said pair of digit lines to a voltage potential, said second portion being connected to said memory cell.

94. The method according to claim 93, wherein said step of charging further comprises:

connecting said second portion of said pair of digit lines to each other.

95. The method according to claim 94, wherein said step of connecting further comprises:

turning on a transistor connected between said pair of digit lines to connect said pair of digit lines to each other.

96. The method according to claim 95, wherein said step of turning on further comprises:

providing a control signal to a gate terminal of said transistor.

97. The method according to claim 96, wherein said control signal is a column select signal.

98. The method according to claim 96, wherein said control signal is complementary to a column select signal.

99. The method according to claim 93, wherein said step of charging further comprises:

charging said second portion of said pair of digit lines to Vcc.

100. The method according to claim 93, wherein said step of charging further comprises:

turning on a first charge transistor having a first terminal connected to a first one of said pair of digit lines, a second terminal connected to said voltage potential, and a gate terminal; and turning on a second charge transistor having a first terminal connected to a second one of said pair of digit lines, a second terminal connected to said voltage potential, and a gate terminal.

101. The method according to claim 100, wherein said step of turning on said first and second charge transistors each further comprises:

providing a control signal to said gate terminal of said first and second charge transistor.

102. The method according to claim 101, wherein said control signal is a column select signal.

103. The method according to claim 101, wherein said control signal is complementary to a column select signal.

104. The method according to claim 92, wherein said step of isolating a first portion of said pair of digit lines further comprises:

turning off a first transistor serially connected in a first one of said pair of digit lines; and turning off a second transistor serially connected in a second one of said pair of digit lines.

105. The method according to claim 104, wherein said step of turning off a first and second transistor each further comprise:

providing a control signal to a gate terminal of said first and second transistors.

106. The method according to claim 105, wherein said control signal is complementary to a column select signal.

107. The method according to claim 105, wherein said control signal is equal to or greater than Vcc during a high state.

108. A method for reading data from a memory cell comprising the steps of:

connecting said memory cell to a first digit line of an associated pair of digit lines to create a voltage differential between said pair of digit lines;

amplifying said voltage differential between said pair of digit lines with an amplification circuit; and connecting said pair of digit lines to an associated pair of output lines m response to a first control signal, wherein said step of connecting said pair of digit lines to an associated pair of output lines further comprises:

isolating a portion of said pair of digit lines from said amplification circuit in response to a second control signal having an inverted phase with respect to said first control signal.

109. The method according to claim 108, wherein said step of isolating further comprises:

turning off a first transistor serially connected in said first digit line of said associated pair of digit lines between said amplification circuit and said memory cell; and turning off a second transistor serially connected in a second digit line of said associated pair of digit lines between said amplification circuit and said memory cell.

110. The method according to claim 108, wherein said step of isolating further comprises:

isolating a majority portion of said pair of digit lines from said amplification circuit.

* * * * *

UNITED STATES PATENT AND TRADEMARK OFFICE
CERTIFICATE OF CORRECTION

PATENT NO. : 6,345,006 B1
DATED : February 5, 2002
INVENTOR(S) : Ingalls et al.

It is certified that error appears in the above-identified patent and that said Letters Patent is hereby corrected as shown below:

Column 7,
Line 66, "trp" should read -- $t_{RP}$ --.

Column 21,
Line 9, "lines m response" should read -- lines in response --.

Signed and Sealed this

Twenty-third Day of July, 2002

*Attest:*

*Attesting Officer*

JAMES E. ROGAN
*Director of the United States Patent and Trademark Office*